(12) United States Patent
Goida

(10) Patent No.: US 9,215,519 B2
(45) Date of Patent: Dec. 15, 2015

(54) REDUCED FOOTPRINT MICROPHONE SYSTEM WITH SPACER MEMBER HAVING THROUGH-HOLE

(75) Inventor: Thomas Goida, Windham, NH (US)

(73) Assignee: INVENSENSE, INC., San Jose, CA (US)

( * ) Notice: Subject to any disclaimer, the term of this patent is extended or adjusted under 35 U.S.C. 154(b) by 534 days.

(21) Appl. No.: 12/847,682

(22) Filed: Jul. 30, 2010

(65) Prior Publication Data
US 2012/0027234 A1   Feb. 2, 2012

(51) Int. Cl.
*H04R 25/00* (2006.01)
*H04R 1/04* (2006.01)
*H04R 31/00* (2006.01)
*H04R 19/00* (2006.01)

(52) U.S. Cl.
CPC ............... *H04R 1/04* (2013.01); *H04R 31/006* (2013.01); *H01L 2224/48091* (2013.01); *H01L 2924/1461* (2013.01); *H01L 2924/3025* (2013.01); *H04R 19/005* (2013.01)

(58) Field of Classification Search
USPC .......................................... 381/150, 360, 423
See application file for complete search history.

(56) References Cited

U.S. PATENT DOCUMENTS

| | | | |
|---|---|---|---|
| 6,041,128 A * | 3/2000 | Narisawa et al. | 381/322 |
| 6,346,742 B1 * | 2/2002 | Bryzek et al. | 257/704 |
| 6,768,196 B2 | 7/2004 | Harney et al. | 257/729 |
| 7,642,657 B2 | 1/2010 | Suilleabhain et al. | 257/778 |
| 7,763,488 B2 | 7/2010 | Goodelle et al. | |
| 7,829,379 B2 | 11/2010 | Goida | 438/107 |
| 7,872,356 B2 | 1/2011 | Sanchez et al. | 257/777 |
| 7,880,244 B2 | 2/2011 | Kierse | 257/414 |
| 7,923,791 B2 * | 4/2011 | Huang et al. | 257/415 |
| 2003/0133588 A1 * | 7/2003 | Pedersen | 381/423 |
| 2007/0158826 A1 * | 7/2007 | Sakakibara | B81B 7/0064 257/723 |
| 2008/0175425 A1 | 7/2008 | Roberts et al. | 381/361 |
| 2008/0247585 A1 * | 10/2008 | Leidl | B81B 7/0061 381/360 |
| 2008/0298621 A1 * | 12/2008 | Theuss et al. | 381/360 |
| 2008/0315333 A1 | 12/2008 | Combi et al. | 257/415 |
| 2009/0057876 A1 | 3/2009 | Chien et al. | 257/704 |
| 2010/0013067 A9 | 1/2010 | Zhang et al. | 257/669 |
| 2010/0086164 A1 | 4/2010 | Gong et al. | 381/369 |
| 2010/0128914 A1 | 5/2010 | Khenkin | 381/361 |
| 2011/0057273 A1 | 3/2011 | O'Donnell et al. | 257/414 |

FOREIGN PATENT DOCUMENTS

EP    2252077    11/2010    ............ H04R 19/00

OTHER PUBLICATIONS

International Searching Authority, International Search Report—International Application No. PCT/US2011/043513, dated Oct. 6, 2011, together with the Written Opinion of the International Searching Authority, 13 pages.

* cited by examiner

*Primary Examiner* — Davetta W Goins
*Assistant Examiner* — Amir Etesam
(74) *Attorney, Agent, or Firm* — Maryam Imam; IPxLaw Group LLP (57) ABSTRACT

A microphone system has a chip system coupled to a base. Among other things, the chip system includes a microphone chip and a circuit chip, in a stacked relationship, configured to electrically communicate. The microphone chip has a diaphragm configured to move upon receipt of an incident audio signal, while the circuit chip has at least one through hole audibly coupled with the diaphragm of the microphone chip.

37 Claims, 6 Drawing Sheets

REDUCED FOOTPRINT MICROPHONE SYSTEM WITH SPACER MEMBER HAVING THROUGH-HOLE

TECHNICAL FIELD

The invention generally relates to microchips and, more particularly, the invention relates to transducer chips.

BACKGROUND ART

MEMS microphones typically are housed within a package interior and controlled by an adjacent integrated circuit chip. The package thus must have a footprint that is large enough to hold both the microphone chip and the integrated circuit chip. In addition, MEMS devices, such as MEMS microphones chips, often have extremely clean microstructure surfaces. Such clean microstructure surfaces, however, can stick together if they come into contact. When the surfaces remain stuck together, the device often is inoperable. This concept of surface sticking is known in the art as "stiction."

A number of different factors can contribute to or cause stiction. For example, among other things, stiction may occur during wet release of a movable MEMS microstructure, where the surface tension of a draining rinse liquid can draw the microstructure into contact with an adjacent part, such as an underlying substrate or backplate (sometimes referred to as "release stiction"). Stiction also may occur to a MEMS microphone when mounting it (i.e., when mounting the package within which a MEMS microphone chip is mounted) to a printed circuit board. For example, flux/solder that secures the MEMS microphone to the circuit board may inadvertently contact the movable microstructure, causing stiction.

SUMMARY OF VARIOUS EMBODIMENTS

In accordance with one embodiment of the invention, a microphone system has a chip system coupled to a base. Among other things, the chip system includes a microphone chip and a circuit chip, in a stacked relationship, configured to electrically communicate. The microphone chip has a diaphragm configured to move upon receipt of an incident audio signal, while the circuit chip has at least one through hole audibly coupled with the diaphragm of the microphone chip.

In one implementation, the circuit chip is secured to a surface of the base, while the microphone chip is secured to a surface of the circuit chip. In that case, the circuit chip may be positioned between the microphone chip and the base. Moreover, various embodiments can have one or more different types of filters to protect the microphone chip. For example, the through hole of the circuit chip may include a plurality of holes that act as a filter. In addition, the assembly may have a filter, between the circuit chip and microphone chip, covering the through-hole.

The microphone system may have an aperture formed in various different surfaces. For example, the base may form an aperture audibly coupled with the through hole in the circuit chip. In some embodiments, the chip system covers this aperture. In other embodiments, a lid forms an interior with the base. Thus, in this embodiment, the lid may form an aperture audibly coupled with the through hole in the circuit chip. Further, in this embodiment, the through hole may form a back volume for the microphone chip. In other embodiments, the assembly may cover the aperture in the lid.

In accordance with other embodiments of the invention, a microphone system has a base and a coupled lid that together form a package with an interior and an inner surface. The package has an aperture and contains a chip system secured to its inner surface. The chip system includes a circuit chip and MEMS microphone chip, coupled in a stacked relationship and configured to electrically communicate. The MEMS microphone chip has a diaphragm configured to move upon receipt of an incident audio signal, while the circuit chip has at least one through hole audibly coupled with the diaphragm of the microphone.

In accordance with another embodiment of the invention, a microphone system has a base and a chip system coupled to the base. The chip system includes a MEMS microphone and a member in a stacked relationship. The MEMS microphone has a diaphragm configured to move upon receipt of an incident audio signal, while the member has at least one through hole audibly coupled with the diaphragm of the MEMS microphone.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Silicon microphone chips known to the inventor typically are protected from the external environment within packages. To receive and process an incident audio signal, however, the diaphragm of a microphone chip generally must be directly exposed to the external environment in some manner. Accordingly, to ensure receipt of an incoming audio signal, some microphone systems mount a microphone chip directly over an aperture through its package, thus directly exposing the diaphragm to the external environment.

Despite improving signal to noise ratios, this design carries risks. Specifically, diaphragms and their support structure often are very fragile. Exposure to the environment can damage the microphone and, consequently, the overall system. For example, during system manufacture, adhesive or solder used to secure the package to a printed circuit board inadvertently can splatter up, through the aperture and onto the diaphragm. As a result, the diaphragm undesirably can stick to the backplate, destroying the microphone chip. The fact that this happens on a system level further compounds the problem since it can render an entire system unusable (e.g., a mobile telephone). To minimize this problem, many microphone systems horizontally space the microphone chip away from the package aperture—e.g., they mount the microphone chip on the package base next to the package aperture. This undesirably reduces the audio signal strength by the time it strikes the diaphragm.

While deciding whether they should sacrifice signal strength for product robustness, or vice versa, the inventor discovered that he could obtain both benefits—without making this undesirable design tradeoff. Specifically, the inventor discovered that mounting the microphone chip over the package aperture, but spacing it away from the hole in a vertical direction, provides both benefits. Thus, illustrative embodiments mount the microphone directly on a spacing device, such as a silicon stud, in a stacked configuration. To directly connect the diaphragm with the external environment, the spacing device has a hole/aperture that directly audibly couples the package aperture with the microphone chip diaphragm. In other words, the hole through the spacing device directly connects the package aperture with the microphone chip—preferably in a substantially sealed relationship. Audio signals entering the package through its aperture thus directly strike the diaphragm as they enter the package interior, thereby providing an improved signal to noise ratio. At the same time, this vertical spacing significantly reduces the amount of mounting material or other debris that can reach the diaphragm.

This realization led to further discoveries. For example, the microphone chip and spacing device have other benefits even if not mounted over the package aperture; i.e., even if they are horizontally spaced from the package aperture. Primarily, when horizontally spaced from the package aperture, the spacing device provides an enhanced back-volume. The inventor believes that, to some extent, this increase in back volume may offset the signal loss caused by the horizontal spacing problem.

In fact, contrary to the conventional wisdom known to him at the time of their invention, the inventor further discovered that, among other things, an integrated circuit (that controls and processes signals on the microphone chip) having a through hole/aperture can serve as the spacing device. Moreover, this configuration favorably reduces the footprint required for the overall package. Details of these and other embodiments are discussed below.

Figure 1:
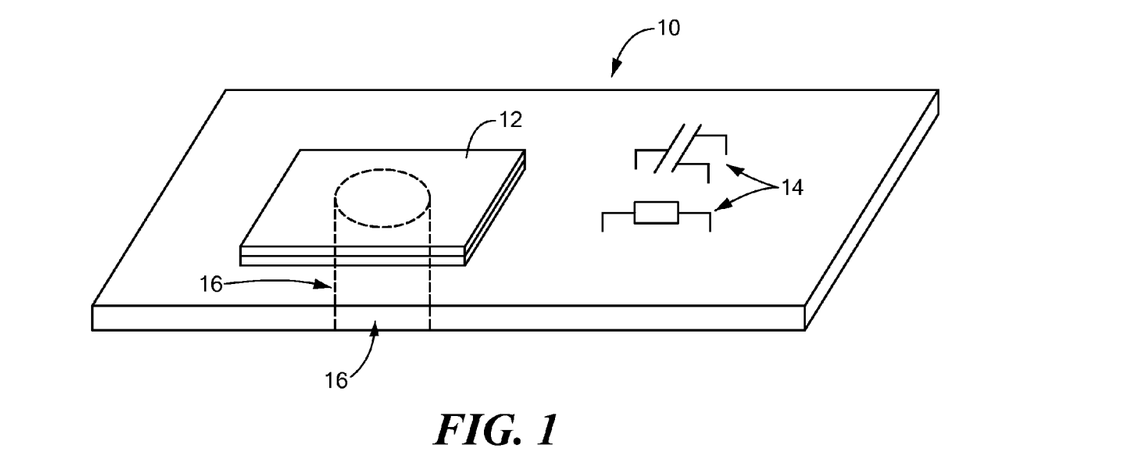
FIG. 1 schematically shows a printed circuit board having a microphone configured in accordance with illustrative embodiments of the invention.

FIG. 1 schematically shows one application of a microphone chip 18 that can implement illustrative embodiments of the invention. Specifically, FIG. 1 schematically shows a printed circuit board 10 supporting and electrically interconnecting a packaged microphone 12 with additional components 14. The packaged microphone 12 cooperates with on-board and off-board circuitry to convert and deliver audio signals to a larger system, such as a mobile telephone or public announcement system.

An aperture 16 (shown in phantom) extends through the printed circuit board 10 to the bottom of the microphone package (identified by reference number 28, discussed in detail below). To ensure proper receipt of the audio signal, the microphone package 28 is sealed to the top surface of the printed circuit board 10 by means of a gasket (e.g., formed from an elastomeric or other sealing material). Accordingly, this arrangement produces an audio signal path through the printed circuit board 10, the gasket, and an aperture 45 in the bottom surface of the package 28.

Those skilled in the art can mount the packaged microphone 12 onto the printed circuit board 10 using any of a variety of different techniques. For example, surface mount technology or lead-through-board technologies (e.g., gull wing mounting) will suffice. Moreover, it should be noted that only the packaged microphone 12 and two other miscellaneous circuit components 14 are shown for simplicity. The circuit board 10 thus may have a number of other components, such as additional microphones, resistors, capacitors, transistors, application-specific integrated circuits, traces, contact pads, etc. . . .

Indeed, the packaged microphone 12 of this embodiment may be formed from a microphone package 28 that contains both a MEMS microphone 18 and application-specific internal circuit (ASIC 30). Illustrative embodiments may use a variety of different types of MEMS microphones, such as that shown in cross-section by FIG. 2.

Figure 2:
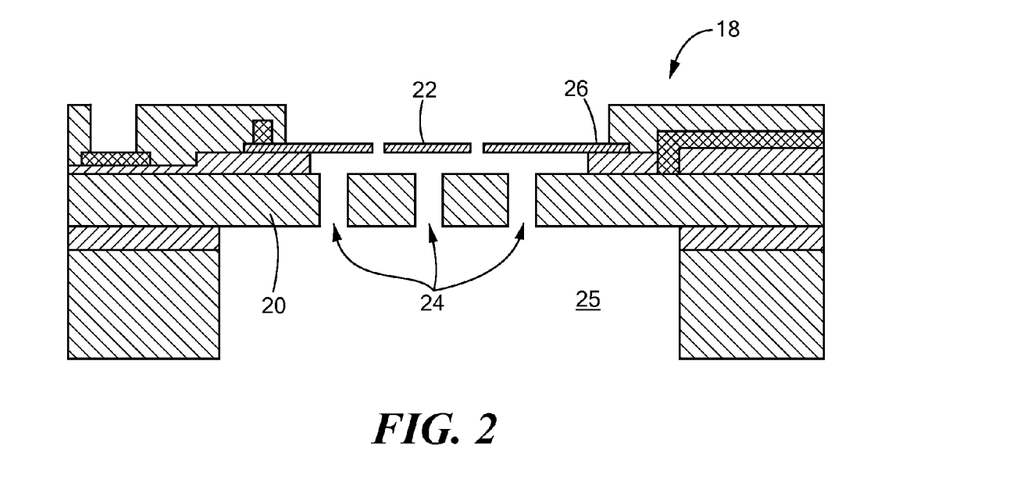
FIG. 2 schematically shows a cross-sectional view of a MEMS microphone that may be used with illustrative embodiments of the invention.

Among other things, the microphone 18 includes a static backplate 20 that supports and forms a variable capacitor with a flexible diaphragm 22. In illustrative embodiments, the backplate 20 is formed from single crystal silicon (e.g., the top layer of a silicon-on-insulator wafer), while the diaphragm 22 is formed from deposited polysilicon. Other embodiments, however, use other types of materials to form the backplate 20 and the diaphragm 22. For example, a single crystal silicon bulk wafer, or some deposited material may form the backplate 20. In a similar manner, a single crystal silicon bulk wafer, part of an silicon-on-insulator wafer, or some other deposited material may form the diaphragm 22. To facilitate operation, the backplate 20 has a plurality of through-holes 24 that lead to a backside cavity 25. As discussed below, these through-holes 24 have a secondary function of acting as a filter that helps prevent debris from contacting the diaphragm 22.

Springs 26 movably connect the diaphragm 22 to the static portion of the microphone 18, which includes the backplate 20. Audio signals cause the diaphragm 22 to vibrate, thus producing a changing capacitance. On-chip or off-chip circuitry (e.g., shown in FIG. 1) receive and convert this changing capacitance into electrical signals that can be further processed.

It should be noted that discussion of the specific microphone 18 shown in FIG. 2 is for illustrative purposes only. For example, microphones having a diaphragm 22 between its backplate 20 backside cavity 25 also should suffice. Other microphone configurations thus may be used with illustrative embodiments of the invention.

Figure 3:
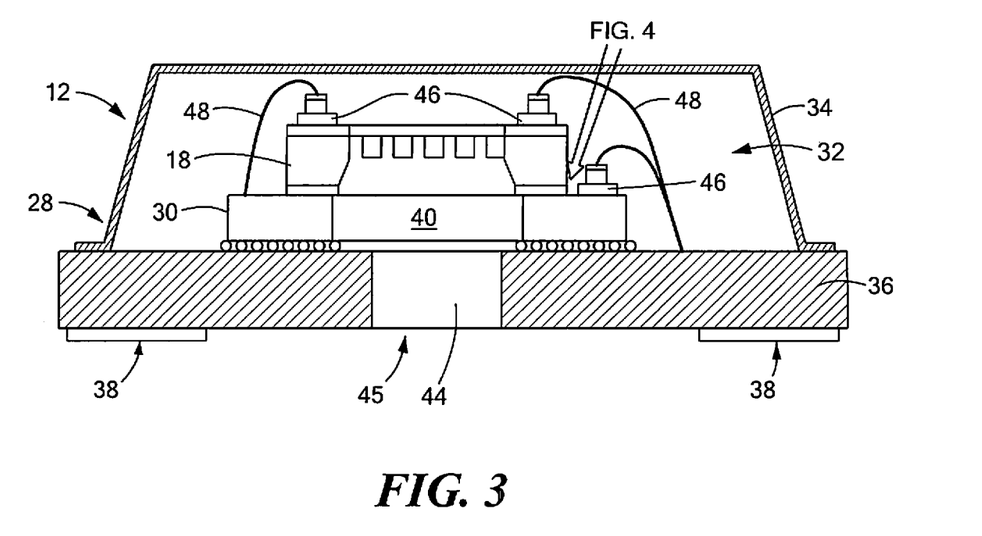
FIG. 3 schematically shows a cross-sectional view of a packaged MEMS microphone configured in accordance with a first embodiment of the invention.

FIG. 3 schematically shows a cross-sectional view of the packaged microphone 12 in accordance with one embodiment of the invention. Specifically, as noted above, the packaged microphone 12 includes a package 28 that contains, protects, and interconnects a MEMS microphone chip 18 (often referred to merely as a "microphone 18" or "MEMS microphone 18") and a corresponding ASIC 30. To that end, the package 28 has a base 32 and coupled lid 34 that together form a package interior 36 for protecting the microphone 18 and its ASIC 30.

Because microphones can be susceptible to radio frequency interference, or electromagnetic interference (EMI), the package 28 preferably incorporates noise reducing technology. Accordingly, illustrative embodiments effectively form a Faraday cage around the microphone 18 in any of a number of different manners. For example, the base 32 may be formed from printed circuit board material, such as FR4 or laminate. Alternatively, the base 32 may be formed from leadframe packaging technology. For example, the base 32 may be formed primarily from a premolded package base, which is formed from a leadframe and injection molding material. The top surface of the premolded base 32 may also have a metal layer to at least in part shield the microphone 18.

A plurality of contact pads 38 on the bottom surface of the base 32 electrically interconnect the interior 36 of the package 28 with the printed circuit board 10. As noted above, various embodiments use other interconnect technologies, such as leads extending from the side or bottom of the package base 32.

The base 32 simply may have a generally planar shape, as shown in FIG. 3. Alternatively, however, the base 32 may have walls to form a cavity that in-part contains the microphone 18 and ASIC 30. In that case, the lid 34 may be flat, or also could form a cavity. In either case, the base 32 of the embodiment shown in FIG. 3 forms an aperture 45 that permits audio signals to enter its interior 36.

To protect the microphone 18 from EMI, the lid 34 preferably is formed from a conductive material. For example, the lid 34 may be formed as a stainless steel cup. Other embodiments may form the lid 34 from other materials, such as plastic coated with a conductive layer, or a conductive plastic (e.g., a plastic material impregnated with conductive filaments).

Conventional techniques connect the lid 34 to the base 32. For example, after mounting the microphone 18 and its corresponding ASIC to the base 32, conventional fabrication processes can connect the lid 34 to the base 32 with an adhesive. As known by those skilled in the art, a difference in the potential between the lid 34 and base 32 undesirably can interfere with movement of the diaphragm 22. Accordingly, conductive adhesive preferably is used to ensure that the lid 34 has the same potential as prescribed portions of the base 32.

In accordance with illustrative embodiments of the invention, the microphone chip 18 and the ASIC 30 are mounted within the package 28 to both reduce package size, and minimize the risk of contaminating the diaphragm 22 with debris entering the interior 36 through the package aperture 45. To that end, the microphone 18 and ASIC 30 are mounted in a stacked configuration within the package. Specifically, FIG. 3 schematically shows a cross-sectional view of the microphone 18 and ASIC 30 in this stacked configuration, in which the microphone 18 is stacked upon the top, generally planar surface of the ASIC 30.

When mounted, preferred embodiments position the microphone 18 so that the backplate 20 is between the ASIC 30 and the diaphragm 22. As noted above, in addition to providing a reference capacitor plate, the backplate 20 in this embodiment also serves as a filter that further aids in preventing debris from contacting the diaphragm 22. Accordingly, the holes 24 through the backplate 20 are sized and positioned in a manner that maximizes its filtering function without impacting its capacitive function. As discussed below, this filter is but one of several means for protecting the diaphragm 22 in this manner.

Unlike conventional ASICs, the ASIC 30 in this embodiment has an aperture (referred to herein as "ASIC aperture 40") directly through its body. The active circuitry of the ASIC 30 therefore is positioned generally about the general periphery of the ASIC body, or to a portion of the ASIC periphery. The ASIC aperture 40 forms a part of an audio signal channel that permits audio signals to contact the diaphragm 22.

Figure 4:
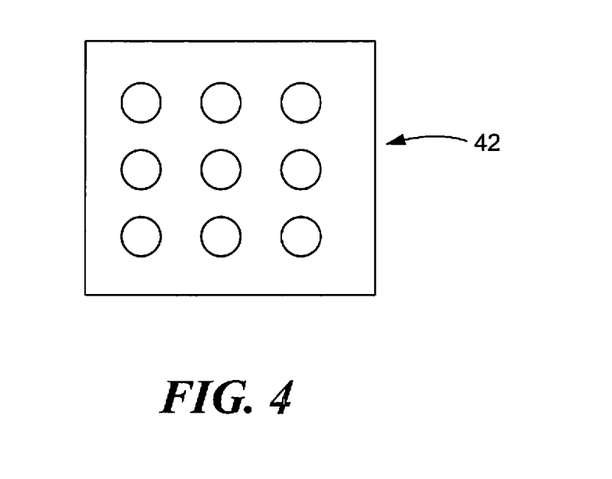
FIG. 4 schematically shows an adhesive film that may be use with illustrative embodiments of the invention.

A number of different attachment means can be used to secure the bottom surface of the microphone 18 to the top, generally planar surface of the ASIC 30. For example, an adhesive about the periphery of the ASIC aperture 40 can provide this function. FIG. 4 schematically shows a nonconductive epoxy film 42 that also may secure the microphone 18 to the ASIC 30. As shown, the epoxy film 42 has a plurality of holes that effectively form another filter for the audio channel. The holes may be sized and positioned relative to the backplate holes 24 to maximize its filtering capabilities. Of course, discussion of a nonconductive epoxy film 42 with filter holes is but one of many ways to connect the two dies together. For example, among other things, an epoxy film with a single hole, a seal ring, or other technique also should suffice.

Figure 5A:
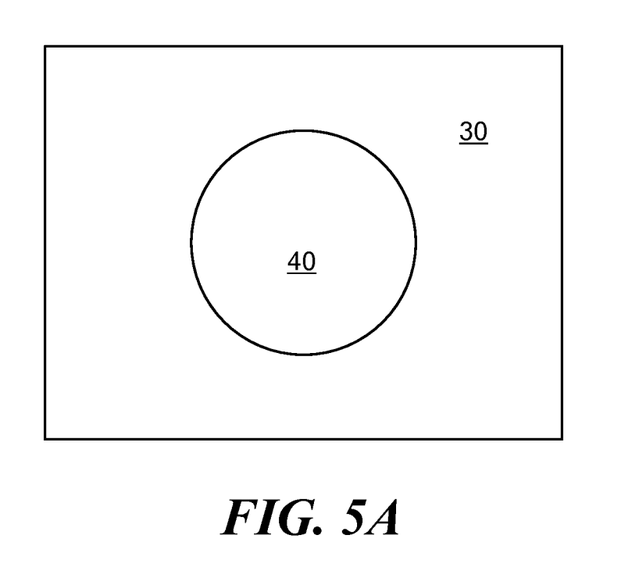
FIGS. 5A and 5B schematically show two different ASIC hole configurations in accordance with illustrative embodiments.

As noted above, the ASIC aperture 40 may include only a single hole (e.g., FIG. 5A). This ASIC aperture 40 may have any of a number of different shapes, such as that of an ellipse, circle, or rectangle. For example, a generally square ASIC 30 having a length and width of about 1.36 millimeters mounted to a smaller microphone 18 can have a generally circular ASIC aperture 40 with a 0.6 millimeter diameter. The inventor expects that these relative dimension should provide satisfactory results. FIG. 5A schematically shows a plan view of an ASIC 30 generally with an ASIC aperture 40 of that size.

Figure 5B:
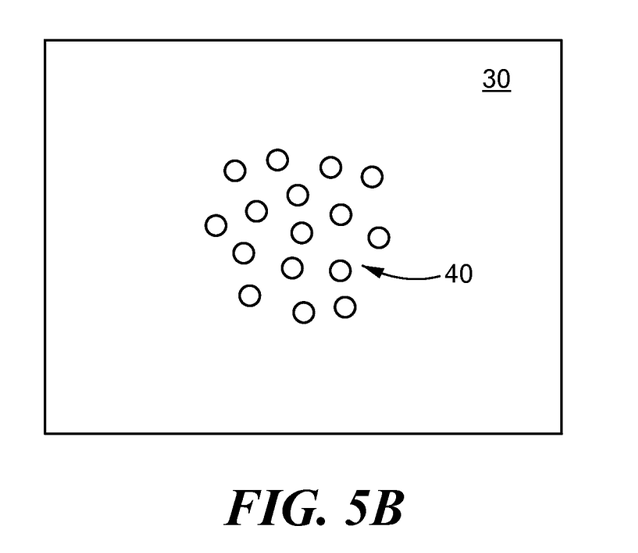

FIG. 5B schematically shows another embodiment in which the ASIC 30 has a plurality of ASIC apertures 40. These ASIC apertures 40 collectively can have a diameter that is comparable to that of the embodiments using a single ASIC aperture 40. Specifically, the outside area of these ASIC apertures 40 has a collective diameter that is comparable to the single ASIC aperture 40 of FIG. 5A. Again, as with the epoxy film 42 and the backplate 20, those skilled in the art can configure the pattern of ASIC apertures 40 in a manner that maximizes debris filtering.

Some embodiments have even more filters. Specifically, some embodiments position filtering material 44 within the base aperture 45 of the package. Such filtering material 44 may be an insert, or integrated directly into the base 32.

Yet other embodiments have a fifth filter between the bottom surface of the ASIC 30 and the top surface of the base 32. For example, a nonconductive film with filter holes, similar to that shown in FIG. 4, can secure the entire chip system (i.e., the stacked microphone 18 and ASIC 30) to the top surface of the base 32.

Those skilled in the art should understand, however, that not all filters are necessary in all embodiments. For example, some implementations may use only two filters, while others may use three filters, and others may use four or five filters. The combination of filters can depend upon a number of factors, including the application in which it is to be utilized, as well as the anticipated technique to be used for securing the packaged microphone 12 to the printed circuit board 10. In addition, those skilled in the art can configure and select the filter(s) to cooperate to maximize filtering, while minimizing audio resistance. For example, the holes through two adjacent but vertically spaced filters may be offset to more effectively capture debris.

The embodiment of FIG. 3 thus preferably forms a substantially sealed audio channel between the external environment and the microphone 18. Specifically, from the exterior to the interior 36, that channel includes the circuit board aperture 16, the first gasket, the base aperture 45, the seal between the ASIC 30 and base 32 (i.e., securing the ASIC 30 to the base 32), the ASIC aperture 40, and the epoxy film 42 between the microphone 18 and the ASIC 30.

Of course, the chip system of stacked die should be electrically connected to the underlying base 32 to function. Accordingly, returning to FIG. 3, both the microphone 18 and ASIC 30 have respective bond pads 46 for electrically connecting their interior components with each other and the base 32 through a plurality of wire bonds 48 or other conventional means. For example, one pad 46 on the microphone 18 may receive power for energizing the variable capacitor formed by the diaphragm 22 and backplate 20, while another bond pad 46 on the microphone 18 may transmit a variable voltage or current signal representing the change in capacitance between the diaphragm 22 and backplate 20. The wire bonds 48 may connect the microphone 18 and the ASIC 30, the microphone 18 and the base 32, and/or the ASIC 30 and the base 32.

For simplicity, subsequent cross-sectional views (i.e., FIGS. 6A, 6B, 7A-7C and 8) do not show these bond pads 46 and wire bonds 48. It nevertheless should be understood that like the embodiment of FIG. 3, these embodiments permit electrical communication between the ASIC 30 and microphone 18, and those components and the base 32.

Using stacked chips/die with an aperture 40 through the ASIC 30 thus favorably solves at least two problems; namely, it reduces the size/footprint of the package, while protecting the diaphragm 22 from environmental debris. As noted above, however, the inventor discovered that this arrangement provides further benefits, which applies to number of different top port and bottom port applications.

Figure 6A:
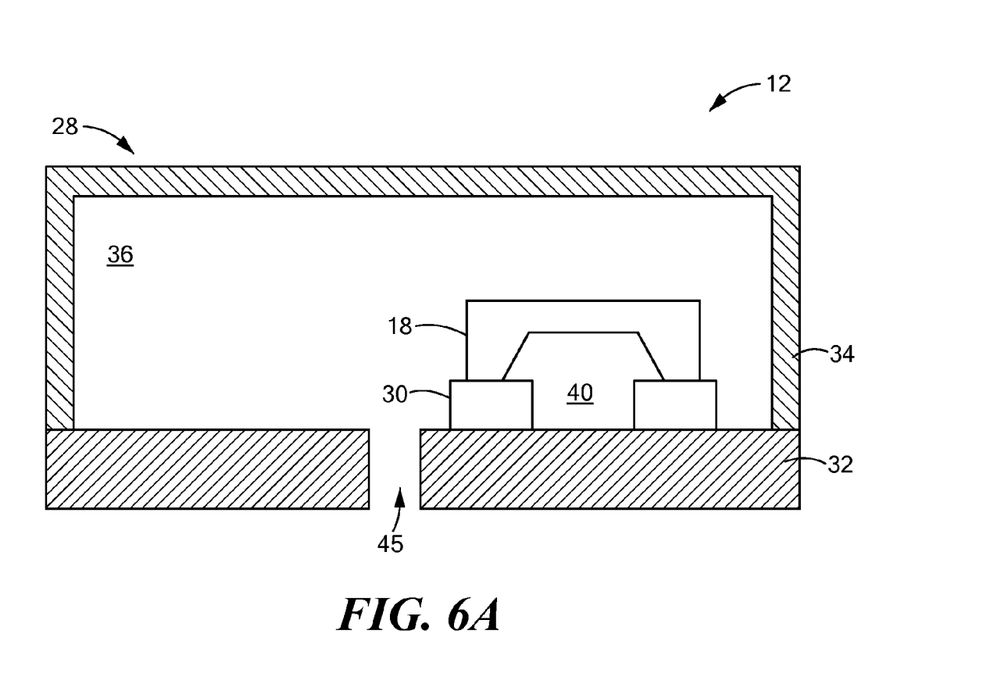
FIGS. 6A-6B schematically show cross-sectional views of two embodiments with an aperture in the base of the package.
Figure 6B:
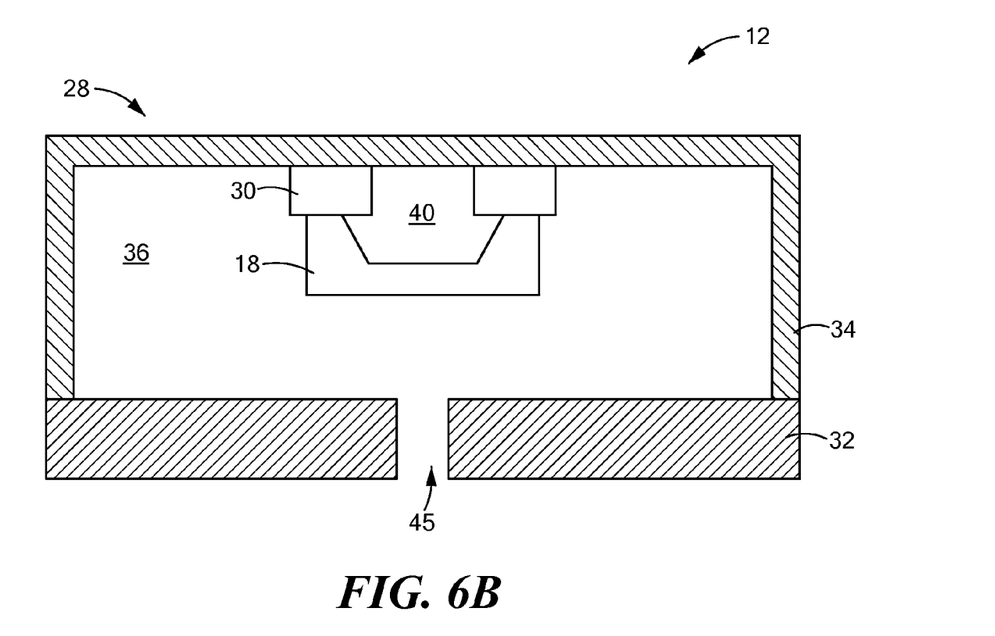

Specifically, the chip system (the microphone chip 18 stacked on the ASIC 30) shown in FIG. 3 substantially completely covers the base aperture 45 to provide an improved contact with the audio signal. In contrast, FIG. 6A schematically shows a cross-sectional view of another embodiment with an aperture 45 through the base 32, but the chip system not covering the base aperture 45. Instead, the chip system is horizontally spaced away from the base aperture 45. FIG. 6B also schematically shows a cross-sectional view of an embodiment with an aperture 45 through the base 32, but the chip system mounted to the interior surface of the lid 34.

Although they do not optimally receive the audio signal as it enters the interior 36 of the package, both embodiments in FIGS. 6A and 6B have the added benefits of an increased back volume and reduced package footprint. For example, prior art direct mount microphones (i.e., microphones 18 directly mounted to their bases 32) known to the inventor similarly spaced from their respective base apertures 45 merely have the backside cavity height of the microphone chip 18 only. These embodiments, however, extend that amount by the ASIC 30 depth. Moreover, these back volume increasing designs are anticipated to be simpler to implement than prior art designs that attempt to increase back volumes by constructing complex closed channels directly in the base 32, and mounting the microphone 18 over those channels. It should be noted that the embodiments shown in FIGS. 6A and 6B, since they are spaced away from their apertures 45 to some extent, may also may be less susceptible to external debris contamination. Despite this, however, they are not directly receiving the audio signal as it enters the package interior 36.

Figure 7A:
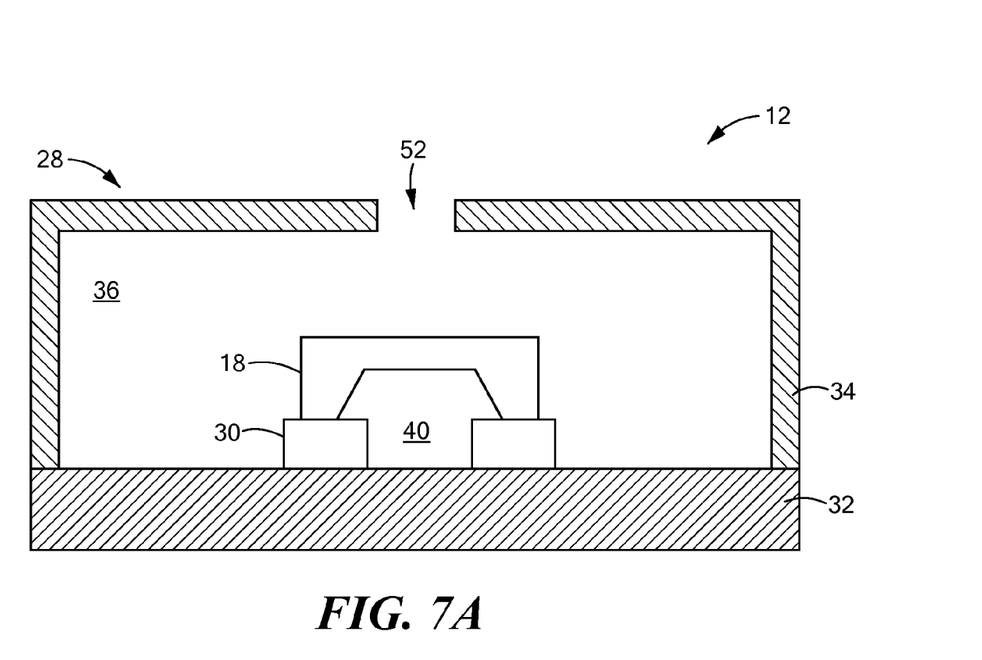
FIGS. 7A-7C schematically show cross-sectional views of three embodiments with an aperture in the lid of a package.
Figure 7B:
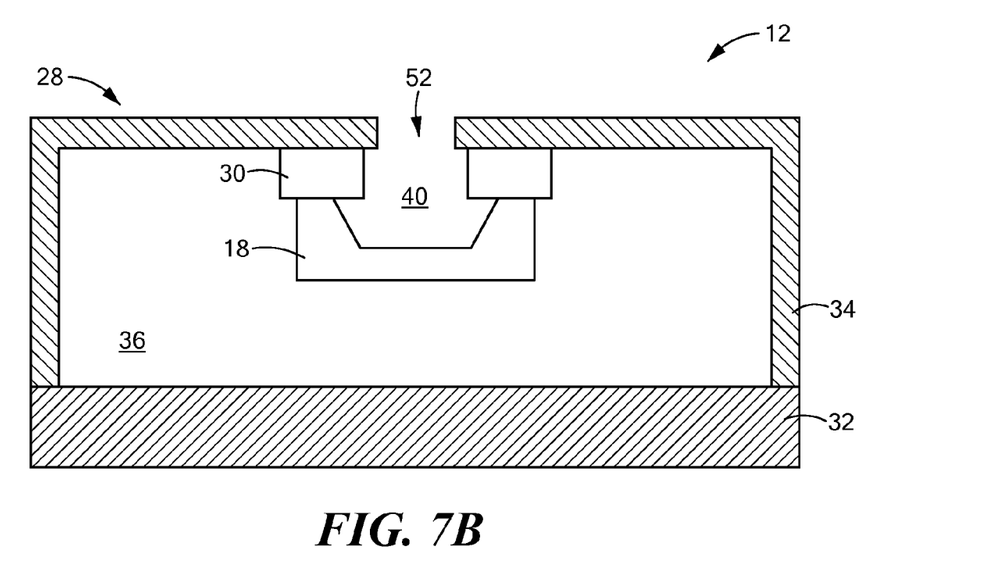
Figure 7C:
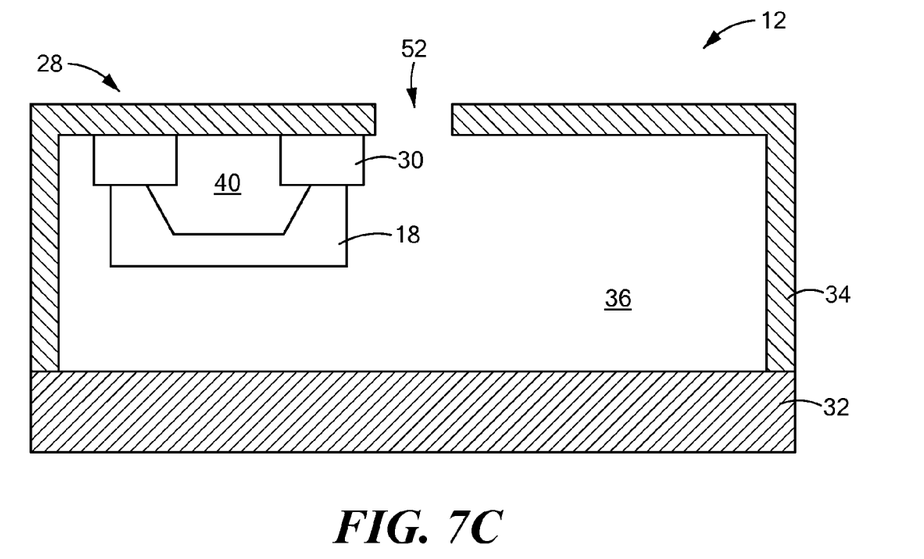
Figure 8:
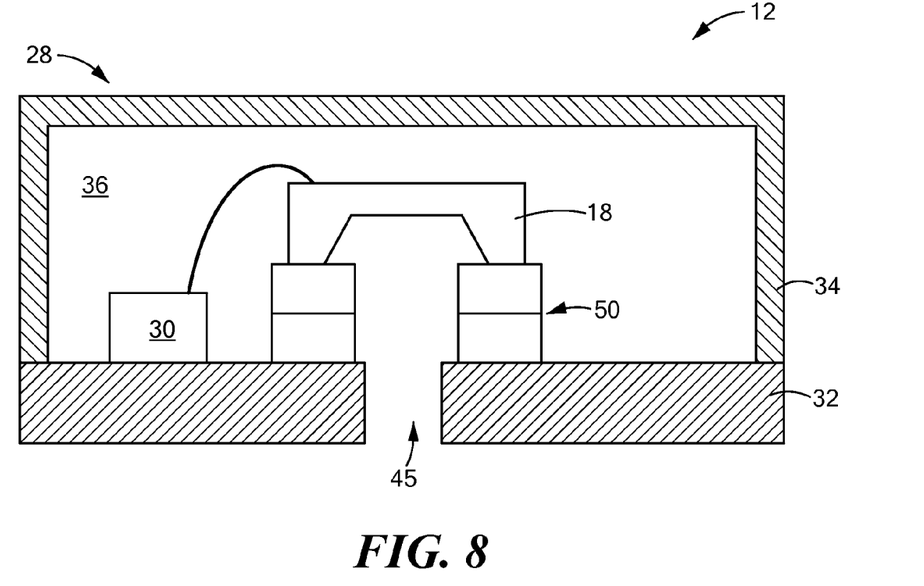
FIG. 8 shows a cross-sectional view of yet another embodiment of the invention.

FIGS. 7A-7C schematically show cross-sectional views of three so-called "top port" embodiments. In other words, these figures schematically show embodiments having no base aperture 45, but an aperture through the lid 34 (referred to as a "lid aperture 52"). In a manner similar to FIG. 3, FIG. 7B mounts the chip system directly over the lid aperture 52 and thus, provides benefits corresponding to those discussed above for FIG. 3. FIGS. 7A and 7C correspondingly do not cover their respective apertures 52 and thus, provide enhanced back volume benefits discussed above with respect to FIGS. 6A and 6B.

The specific embodiments discussed thus far have primarily focused on using an ASIC 30 to provide the vertical spacing for the microphone 18. Some embodiments, however, simply use a spacing member 50 (i.e., a spacing member other than the ASIC 30, which acts as a spacing member in some embodiments) to provide this function. For example, the spacing member 50 may include a silicon stud (i.e., an inactive piece of silicon) with an aperture 40. Other embodiments, such as that shown in FIG. 8, may include a plurality of spacing members 50, and an ASIC 30 mounted on the base 32, next to the chip system. These spacing members 50 and ASIC 30 have apertures 40 as discussed. Other embodiments stack an ASIC 30 with its ASIC aperture 40, and one or more spacing members 50 with their respective apertures 40, underneath the microphone 18. The ASIC 30 may be positioned in that stack in any of a variety of locations, such as on the bottom—spaced from the microphone 18, or directly contacting the microphone 18.

Various embodiments discussed above thus improve upon prior or devices in a number of ways, such as by:
reducing the footprint/package 28 size,
protecting the microphone chip 18 from environmental debris, and
improving back volume, were applicable.

It should be noted that specifics of various embodiments for any one of the above noted figures can apply to other figures. For example, the various filter combinations discussed with respect to FIG. 3 also can be applied to the microphone designs discussed in FIGS. 6A, 6B, 7A-7C, and 8. Moreover, these designs can be combined with features not discussed above, such as unidirectional microphones having two or more package apertures 45 or 52, or other transducer types, such as pressure sensors and speakers.

Accordingly, although the above discussion discloses various exemplary embodiments of the invention, it should be apparent that those skilled in the art can make various modifications that will achieve some of the advantages of the invention without departing from the true scope of the invention.

What is claimed is:

1. A microphone system comprising:
    a base;
    a chip system coupled to the base, the chip system comprising a microphone chip and a circuit chip in a stacked relationship, the circuit chip having a body, the circuit chip and microphone chip being configured to electrically communicate,
    the microphone chip having a diaphragm configured to move, relative to the backplate, upon receipt of an incident audio signal, the backplate having a plurality of backplate holes, the circuit chip having at least one through hole directly through the circuit chip body forming at least a part of the audio channel to permit audio signals to contact the diaphragm therefore audibly coupled with the diaphragm of the microphone;
    a filtering material covering the through hole; and
    a nonconductive epoxy film formed about the periphery of the at least one through hole of the circuit chip, securing the microphone chip to the circuit chip and having a plurality of holes that effectively form another filter for and inside the audio channel,
    the through hole having a top opening on one side of the circuit chip, the through hole having a bottom opening on the opposite side of the circuit chip, the top opening and the bottom opening having substantially identical dimensions.

2. The microphone system as defined by claim 1 wherein the circuit chip is secured to a surface of the base and the microphone chip is secured to a surface of the circuit chip, the circuit chip being positioned between the microphone chip and the base.

3. The microphone system as defined by claim 1 wherein the through hole comprises a plurality of holes that act as a second filter.

4. The microphone system as defined by claim 1 wherein the base forms an aperture audibly coupled with the through hole in the circuit chip.

5. The microphone system as defined by claim 4 wherein the chip system covers the aperture.

6. The microphone system as defined by claim 1 further comprising a lid that forms an interior with the base, the assembly being within the interior, the lid forming an aperture audibly coupled with the through hole in the circuit chip.

7. The microphone system as defined by claim 6 wherein the through hole forms a back volume for the microphone chip.

8. A microphone system comprising:
a base;
a lid coupled to the base to form a package with an interior and an inner surface;
an aperture formed though the package;
a chip system secured to the inner surface, the chip system including a circuit chip and MEMS microphone chip coupled in a stacked relationship, the circuit chip have a body,
the circuit chip and MEMS microphone chip being configured to electrically communicate,
the MEMS microphone chip having a diaphragm configured to move, relative to a backplate, upon receipt of an incident audio signal, the backplate having a plurality of backplate holes,
the circuit chip having at least one through hole directly through the circuit chip body forming at least a part of the audio channel to permit audio signals to contact the diaphragm therefore audibly coupled with the diaphragm of the microphone;
a filtering material covering the through hole; and
a nonconductive epoxy film formed about the periphery of the at least one through hole of the circuit chip, securing the microphone chip to the circuit chip and having a plurality of holes that effectively form another filter for and inside the audio channel,
the through hole having a top opening on one side of the circuit chip, the through hole having a bottom opening on the opposite side of the circuit chip, the top opening and the bottom opening having substantially identical dimensions.

9. The system as defined by claim 8 wherein the base forms the aperture, the chip system secured to the base covering the aperture, the circuit chip being between the MEMS microphone chip and the base.

10. The system as defined by claim 8 wherein the lid forms the aperture, the through hole forming a back volume for the MEMS microphone chip.

11. The system as defined by claim 8 further comprising a second filter between the aperture and the diaphragm.

12. The system as defined by claim 11 wherein the second filter covers one of the aperture and the through hole.

13. The system as defined by claim 11 wherein the second filter is coupled between the MEMS microphone chip and the circuit chip.

14. The system as defined by claim 8 wherein the base comprises circuit board material and the lid comprises a conductor.

15. A microphone system comprising:
a package having a base and forming an interior;
a chip system coupled to the base within the package interior, the chip system comprising a MEMS microphone and a member in a stacked relationship, the member having a body,
the MEMS microphone having a diaphragm configured to move, relative to a backplate, upon receipt of an incident audio signal, the member having at least one through hole directly through the member body forming at least a part of an audio channel to permit audio signals to contact the diaphragm therefore audibly coupled with the diaphragm of the MEMS microphone, the backplate having a plurality of backplate holes; and
a filtering material covering the through hole; and
a nonconductive epoxy film formed about the periphery of the at least one through hole of the circuit chip, securing the microphone chip to the circuit chip and having a plurality of holes that effectively form another filter for and inside the audio channel,
the through hole having a top opening on one side of the member, the through hole having a bottom opening on the opposite side of the member, the top opening and the bottom opening having substantially identical dimensions.

16. The microphone as defined by claim 15 wherein the member comprises a circuit chip in electrical communication with the MEMS microphone.

17. The microphone as defined by claim 15 wherein the member comprises an inactive silicon member.

18. The microphone as defined by claim 15 wherein the base comprises an aperture, the member being coupled to the base and covering the aperture.

19. The microphone as defined by claim 1 wherein the microphone die comprises a variable capacitor and a backside cavity, the chip system being configured so that the backside cavity is between the variable capacitor and the circuit chip.

20. The microphone system as defined by claim 1 wherein the base has an aperture and the filtering material is integrated into the base aperture.

21. The microphone system as defined by claim 1 wherein the filtering material is an insert in the base.

22. The microphone system as defined by claim 1 wherein the base has an aperture coupled to the through hole.

23. The microphone system as defined by claim 1 wherein the base has an aperture that is horizontally spaced from the through hole.

24. The microphone system as defined by claim 1 further including a lid coupled to the base and wherein the circuit chip is coupled to lid such that the through hole is positioned over the lid.

25. The microphone system as defined by claim 24, wherein the base has an aperture.

26. The microphone system as defined by claim 1 wherein the filtering material is in the base aperture.

27. The microphone system as defined by claim 26 wherein the filtering material is an insert.

28. The microphone system as defined by claim 1 wherein the circuit chip body includes active circuitry positioned generally about the general periphery of the circuit chip body.

29. The microphone system as defined by claim 1 wherein the circuit chip body includes active circuitry positioned generally about a portion of the periphery of the circuit chip.

30. The microphone system as defined by claim 8 wherein the circuit chip body includes active circuitry positioned generally about the general periphery of the circuit chip.

31. The microphone system as defined by claim 8 wherein the circuit chip body includes active circuitry positioned generally about a portion of the periphery of the circuit chip.

32. The microphone system as defined by claim 15 wherein the member body includes active circuitry positioned generally about the general periphery of the member.

33. The microphone system as defined by claim 15 wherein the member body includes active circuitry positioned generally about a portion of the periphery of the member.

34. The microphone system as defined by claim 15 wherein the member includes a seal between the member and the MEMS microphone to acoustically seal the through hole to the MEMS microphone to form a portion of the audio channel, further wherein the seal is positioned in between and in direct contact with the member and the microphone chip and the circuit chip has holes and the seal includes holes and the seal holes, the backplate holes and the holes in the circuit chip are aligned.

35. The microphone system as defined by claim 1 wherein the holes of the nonconductive epoxy film are sized and positioned relative to the holes of the backplate to maximize the filtering capability of the nonconductive epoxy film.

36. The microphone system as defined by claim 8 wherein the holes of the nonconductive epoxy film are sized and positioned relative to the holes of the backplate to maximize the filtering capability of the nonconductive epoxy film.

37. The microphone system as defined by claim 15 wherein the holes of the nonconductive epoxy film are sized and positioned relative to the holes of the backplate to maximize the filtering capability of the nonconductive epoxy film.

\* \* \* \* \*